United States Patent
Ro et al.

[11] Patent Number: 6,074,936
[45] Date of Patent: Jun. 13, 2000

[54] METHOD OF FABRICATING A QUANTUM DEVICE

[75] Inventors: Jeong Rae Ro; Sung Bock Kim; El Hang Lee, all of Daejeon, Rep. of Korea

[73] Assignee: Electronics and Telecommunications Research Institute, Deajeon, Rep. of Korea

[21] Appl. No.: 09/093,195

[22] Filed: Jun. 8, 1998

[30] Foreign Application Priority Data

Aug. 15, 1997 [KR] Rep. of Korea ................... 97-37363

[51] Int. Cl.[7] .......................... H01L 21/36; H01L 21/00
[52] U.S. Cl. .......................... 438/504; 438/46; 438/962
[58] Field of Search .................... 438/22, 46, 47, 438/497, 498, 503, 504, 759, 778, 962; 257/94, 618, 622; 372/43, 44

[56] References Cited

U.S. PATENT DOCUMENTS 5,436,191  7/1995  Paell et al. .
5,532,184  7/1996  Kato .
5,571,376  11/1996  Bestwick et al. .

OTHER PUBLICATIONS

Realization of cresent–shaped SiGe quantum wire structures on a V–groove patterned Si substrate by gas–source Si molecular beam epitaxy: N. Usami, T. Mine, S. Fukatsu and Y. Shiraki; 1993; pp. 2789–2791.

Compositition profile of an AlGaAs epilayer on a V–grooved substrate grown by low–pressure metalorganic vapor phase epitaxy; Wugen Pan, Hiroyuki Yaguchi, Kentaro Onabe, Ryoichi Ito and Yasuhiro Shiraki; 1995; pp. 959–961.

*Primary Examiner*—Charles Bowers
*Assistant Examiner*—Keith Christianson
*Attorney, Agent, or Firm*—Antonelli, Terry, Stout & Kraus, LLP

[57] ABSTRACT

A method of fabricating quantum wire structures and devices, and quantum dot structures and devices comprise steps of: depositing an insulating layer on a semiconductor substrate, forming a line patterns and a square patterns in an insulating layer, forming a V-grooved patterned structures and a reverse quadrilateral pyramid patterned structures by thermal etching to evaporate portions of the quantum well layer that are not protected by line-shaped mask regions and square-shaped mask regions of the masking layer, forming a quantum wires and a quantum dots by alternatively growing a barrier layer and an active layer on a V-grooved patterned substrate and a reverse quadrilateral pyramid patterned substrate.

7 Claims, 2 Drawing Sheets

(a)

(b)

(a)

(b)

METHOD OF FABRICATING A QUANTUM DEVICE

BACKGROUND OF THE INVENTION

1. Field of the Invention

The present invention relates to a method of fabricating a quantum device, and more particularly to a method of fabricating a quantum device which includes a quantum wire or a quantum dot.

2. Description of the Related Art

In order to improve the performance of an optical apparatus and a apparatus, such as an electronic computer, there is a demand for optical semiconductor devices and electrical semiconductor devices that have higher performance. A semiconductor quantum wire or dot utilizing the quantum mechanical properties of electrons can provide a semiconductor device structure meeting such demand.

Such a semiconductor quantum wire or dot would afford a lower threshold current of a semiconductor laser, improved performance of an optical nonlinear material, and larger integration, higher speed and more functional operation of a semiconductor integrated circuit.

Recently, in order to realize the quantum device, the electrical and optical characteristics of quantum wire structure and quantum dot structure have been studied, and new structures of these devices have been proposed. However, it is very difficult to produce a semiconductor structure including a plurality of quantum wires or quantum dots having a size of about several score of nanometers, both easily and reliably. The fine patterns of the quantum wire structure and the quantum dot structure are formed by using a standard electron beam (EB) lithography and a dry etching. But, the fabrication process of the quantum device, such as EB lithography and dry etching, has unsuitable elements, because process time is very long, and the device characteristics according to a various kind of defects induced by dry etching process are decreased.

SUMMARY OF THE INVENTION

In view of shortcomings as described above, it is an object of this invention to fabricate quantum wire structures and devices, and quantum dot structures and devices without producing a lot of surface states.

Another object of the present invention is to provide an improved method for fabricating a quantum device, includes reducing processing time and simplifying such process by using photolithography and wet etching apparatuses, and an effective method therefore.

Another object of the present invention is to provide a method for easily producing quantum wire structure and quantum dot structure of a high performance quantum device.

According to the present invention, there is provided a method of depositing an insulating layer on a semiconductor substrate, forming a line patterns and square patterns on an insulating layer, forming V-grooved patterned structures and reverse quadrilateral pyramid patterned structures by thermal etching to evaporate portions of the quantum well layer that are not protected by line-shaped mask regions and square-shaped mask regions of the masking layer, forming quantum wires and quantum dots by alternatively growing a barrier layer and an active layer on a V-grooved patterned substrate and a reverse quadrilateral pyramid patterned substrate.

BRIEF DESCRIPTION OF THE DRAWINGS

These and other objects, and features and advantages of the invention, as well as the invention itself, will become better understood by reference to the following detailed description of the presently preferred embodiments when considered in conjunction with the accompanying drawings, wherein.

DETAILED DESCRIPTION OF THE PREFERRED EMBODIMENTS

A method of fabricating a quantum device according to the present invention will be described in detail with reference to FIGS. 1 to 4.

Figure 1:
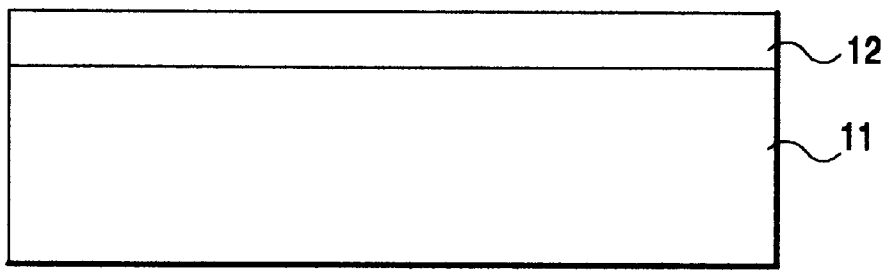
FIG. 1 is a cross-sectional view of a silicon oxide deposited on the substrate according to the present invention.
Figure 2:
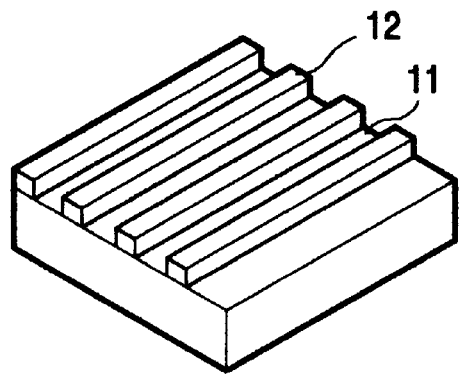
FIGS. 2a and 2b are cross-sectional diagrams of line patterned structures and square patterned structure for quantum wires and quantum dots respectively, according to the present invention.
Figure 2:
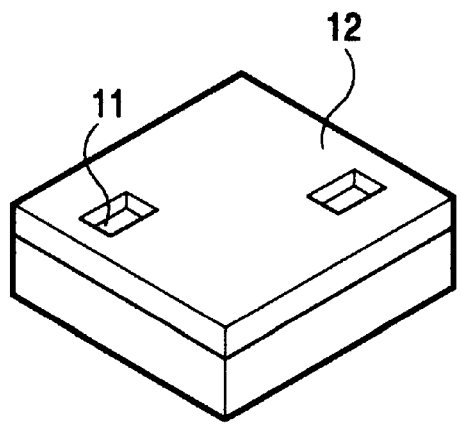

As shown in FIG. 1, first, a silicon oxide layer 12 is deposited on a main surface of a GaAs substrate 11. The silicon oxide layer 12 is approximately 200 nm thick. The silicon oxide layer 12 is used to a pattern definition or a mask layer for chemical etching.

Next, as shown in FIG. 2a, line patterns having a 1 $\mu$m line width and a separation of 2–3 $\mu$m are formed on a silicon oxide layer 12 by conventional photolithography and chemical wet etching. As shown in FIG. 2b, square patterns having an area of 1 $\mu$m×1 $\mu$m are formed on a silicon oxide layer 12 by conventional photolithography and chemical wet etching.

Figure 3:
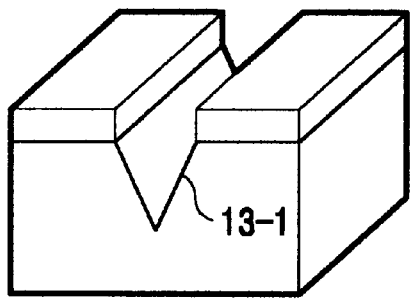
FIGS. 3a and 3b are cross-sectional views of a V-grooved patterned structure and a reverse quadrilateral pyramid patterned structure for a quantum wire and a quantum dot respectively, according to the present invention.
Figure 3:
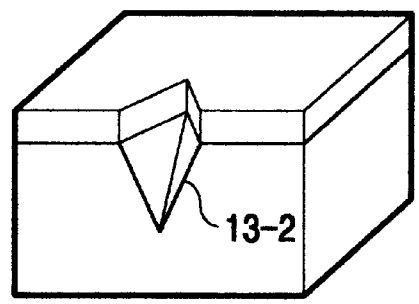
Figure 4:
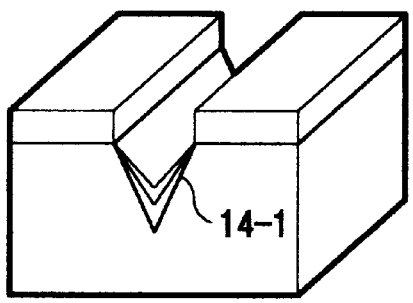
FIGS. 4a and 4b are cross-sectional views of a quantum wire quantum dot grown a barrier layer and an active layer on a V-grooved patterned substrate and a reverse quadrilateral pyramid patterned substrate respectively, according to the present invention.
Figure 4:
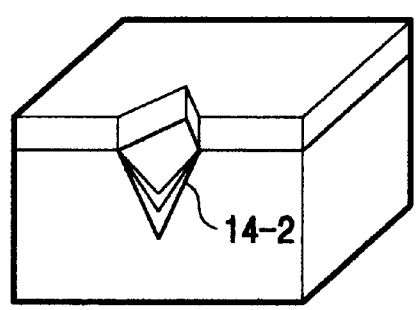

As shown in FIG. 3a, V-grooved patterned structures 13 with a smooth surface are formed on a GaAs substrates by thermal etching. As shown in FIG. 3b, reverse quadrilateral pyramid patterned structures 13-1 are formed on a GaAs substrate by thermal etching. The pattern fabrication of two structures of FIG. 3, first, the samples of FIG. 2 put into a chemical beam deposition apparatus, next, is formed by thermal etching after heating at a high temperature in low arsenic (As) at partial pressure. Thermal etching is used to evaporate the portions of quantum well layer that are left uncovered by the masking layer so as to form of quantum wires and quantum dots.

As shown in FIG. 4a, barrier layer and active layer for fabricating quantum wire 14-1 and quantum dot 14-2 are alternatively grown on a V-grooved patterned substrate 13-1 and a reverse quadrilateral pyramid patterned substrate 13-2, respectively. The growth structure in the V-groove substrate consisted of a AlGaAa barrier layer and a GaAs active layer. The growth rate of a GaAs active layer is much slower on the A sidewall and faster on the bottom surface. Therefore, a quantum wire 14-1 and a quantum dot 14-2 are formed to the bottom part of a V-groove substrate and a reverse triangle-pyramid substrate, respectively.

According to the present invention, process steps for fabricating a quantum wire and a quantum dot can be reduced, so that EB lithography and dry etching, and a lot of surface states are not used, and a quantum well structure on the silicon oxide layer is not formed. Also, the number of defects in quantum wire and a quantum dot is originally removed, so that the dry etching is not used.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of fabricating a quantum confined device said method, comprising the steps of:

depositing an insulating layer on a semiconductor substrate;

forming line patterns and square patterns on a side insulating layer;

forming V-grooved patterned structures and reverse quadrilateral pyramid patterned structures by thermal etching to evaporate portions of the quantum well layer that are not protected by line-shaped mask regions and square-shaped mask regions of a masking layer, respectively; and forming a barrier layer and an active layer for a quantum wire and a quantum dot on a side V-grooved patterned substrate and a reverse quadrilateral pyramid patterned substrate, respectively.

2. A method of fabricating a quantum confined device of claim 1, wherein the masking layer is an insulating layer.

3. A method of fabricating a quantum confined device of claim 2, wherein the insulating layer is a silicon oxide layer.

4. A method of fabricating a quantum confined device of claim 1, wherein the quantum wire is formed by selectively growing on the V-groove substrate.

5. A method of fabrication a quantum confined device of claim 1, wherein the quantum dot is formed by selectively growing on the reverse quadrilateral pyramid substrate.

6. A method of fabricating a quantum confined device of claim 1, wherein the material of the barrier layer is AlGaAs.

7. A method of fabrication a quantum confined device of claim 1, wherein the material of the active layer is GaAs.

* * * * *